March 27, 1962 E. J. SHELTON, JR 3,027,521

TUNABLE STABILIZED TRAVELING WAVE TUBE OSCILLATOR

Filed Jan. 8, 1958 3 Sheets-Sheet 1

INVENTOR
EARL J. SHELTON, JR.

BY Elmer J. Gorn
ATTORNEY

INVENTOR
EARL J. SHELTON, JR.
BY Elmer J. Gorn
ATTORNEY

March 27, 1962 E. J. SHELTON, JR 3,027,521

TUNABLE STABILIZED TRAVELING WAVE TUBE OSCILLATOR

Filed Jan. 8, 1958 3 Sheets-Sheet 3

INVENTOR
EARL J. SHELTON, JR.

BY H. Vincent Harsha
ATTORNEY

United States Patent Office 3,027,521
Patented Mar. 27, 1962

3,027,521
TUNABLE STABILIZED TRAVELING WAVE TUBE OSCILLATOR

Earl J. Shelton, Jr., Needham, Mass., assignor to Raytheon Company, a corporation of Delaware
Filed Jan. 8, 1958, Ser. No. 707,726
14 Claims. (Cl. 331—82)

This invention relates to a tunable stabilized microwave oscillator and more particularly to an oscillator system using a stabilizing cavity resonator which is loaded by a damping impedance at frequencies other than the resonant frequency of the cavity resonator.

Experience has shown that oscillator circuits having sufficiently high Q for stabilization also have lower circuit efficiency and are limited in the amount of stabilization obtainable. In order to obtain stabilization of a sufficient degree, it has been found necessary to couple to the oscillator circuit a high Q resonator. This can be considered as effectually raising the unloaded Q of the oscillator circuit and is possible because a cavity resonator which is not limited in configuration by electron interaction considerations can be made to have an unloaded Q many times larger than that of a microwave oscillator circuit. However, difficulties also arise since unity coupling between the oscillator circuit and the cavity resonator cannot be achieved in practice; furthermore, additional resonant frequencies are involved and tuning becomes more difficult since more than one circuit now must be tuned. For example, at microwave frequencies, it is practically impossible to connect a cavity resonator to a microwave oscillator circuit, such as a magnetron or klystron, without using a significant length of transmission line or some resonant coupling device between the oscillator and the cavity resonator. If all three circuits are tuned to the same frequency and proper adjustment of the circuit Q's is made, the oscillator can be made to oscillate stably at this frequency with good circuit efficiency. It may be shown by ordinary circuit analysis and by actual experiment that only small differences in the resonant frequencies of the various circuits of such an oscillator system can be tolerated if stable operation is to be maintained. Consequently, it is necessary that all three circuits of this type of oscillator system be tuned together if a tunable oscillator of a sufficient degree of stabilization is desired; in other words, the oscillator, the cavity resonator and the device coupling the oscillator and the cavity resonator must be tuned simultaneously. This tuning complicates the oscillator system and limits the usefulness thereof.

In accordance with the invention, an oscillator system is obtained which eliminates one of the three tuning adjustments above-mentioned while maintaining the advantages of a high degree of frequency stability, tuning capability, and high circuit efficiency. This may be accomplished by eliminating the frequency sensitivity of the coupling device inserted between the oscillator and the cavity resonator.

The oscillator system according to the invention consists essentially of a traveling wave-type tube, a stabilizing cavity resonator, a damping impedance element either in series or in parallel with the cavity resonator, an output energy reflecting means, and transmission lines joining together various ones of the above elements. Basically, the oscillator is a stabilized self-excited oscillator utilizing a tube of the type shown and described in a copending application by William C. Brown, Serial No. 362,798, filed June 19, 1953, now United States Patent No. 2,859,411, issued November 4, 1958, which is fitted with the external stabilizing circuit and damping resistor. The traveling wave tube includes a circular but nonreentrant slow-wave propagating structure capable of transmitting radio-frequency energy and having terminations at both ends, as well as a more or less continuously coated cathode positioned coaxial to the slow-wave structure. A unidirectional potential is applied between the cathode and the slow-wave structure producing an electric field between these two electrodes, while a magnetic field is provided parallel to the axis of the cathode and transverse to the electric field between the cathode and the slow-wave structure. As the unidirectional potential between the cathode and the slow-wave structure reaches a certain value, the electrons from the cathode take the form of a rotating space charge hub with spokes of space charge or electrons projecting from the hub. When the angular velocity of the outermost electrons of the space charge becomes substantially synchronous with the velocity of a radio-frequency wave traveling along the slow-wave structure, the electrons in the space charge spokes deliver energy to the radio-frequency circuit and, in the absence of a driving signal, self-oscillations may be produced.

A portion of the energy produced by interaction between the electron beam and the radio-frequency wave propagating along the slow-wave structure is reflected from a relatively frequency-insensitive mismatch or reflecting means at or near the output end of the tube. This mismatch can be either internal or external to the tube itself. Energy thus reflected travels back through the slow-wave propagating structure of the tube with little or no attenuation or reflection and out to the region of the cavity resonator, where most of the energy again is reflected. The phase of the latter reflection depends upon the frequency of the incident energy and upon the resonant frequency of the cavity resonator. The reflected energy then is amplified by the backward wave principle and arrives at the output mismatch at full output level. Steady oscillations will occur only if the loop phase shift from the cavity resonator to the output mismatch and return is an integral multiple of 360°.

The slope of the phase shift versus frequency characteristic of the stabilizing cavity in the region of cavity resonance is much greater than that of any other element in the oscillator circuit. The amount of reflection from a cavity resonator is substantially independent of frequency, and it has been found that, in the absence of the damping impedance element in the oscillator system, the oscillator tends to operate at some frequency removed from the resonant frequency of the cavity resonator, namely, at some frequency wherein the total phase shift around the loop is an integral multiple of 360°. In accordance with the invention, the tube may be made to oscillate in the region of the resonant frequency of the cavity resonator because of the damping resistor which selectively absorbs all incident energy unless it be at a frequency close to that of the resonant frequency of the cavity resonator, leaving no reflected signal for excitation of the oscillator at frequencies and loop phase shifts corresponding to the other integral multiples of $2\pi$ radians.

The damping resistor may be connected either in series with a parallel resonant cavity resonator or the damping resistor may be connected in shunt with a series resonant cavity resonator. In either event, the stabilizing cavity attached to the terminals of the tube opposite the output terminals and the impedance level of the cavity resonator and the resistance of the damping resistor is adjusted so that, at the resonant frequency of the cavity resonator, the damping load may be neglected and very little energy is absorbed therein. At frequencies other than the resonant frequency of the cavity resonator, the damping load becomes a considerable factor and serves to load heavily the oscillator circuit, thus reducing the tendency toward oscillation. If a parallel resonant cavity resonator is connected in series with the damping resistor, the cavity resonator thereby presents effectively an open circuit at the terminals of the oscillator tube opposite the output terminals. Reflections thus occur from this end of the tube and oscillations may be sustained in the manner previously described at the parallel resonant frequency of the cavity resonator. At frequencies other than the resonant frequency of the cavity resonator, the damping load impedance matches that of the transmission line connected to the end of the tube opposite the output terminals and energy is absorbed in the damping resistor. If a series resonant cavity resonator is connected in shunt with the damping resistor, energy will be absorbed without reflection in the damping resistor except at or near the series resonant frequency of said resonator. During the condition of series resonance, the impedance of the resonator is extremely low and the equivalent of a short circuit exists across the terminals of the tube opposite to the output terminals; reflections thereby occur from the end of the line in such a manner as to permit the tube to oscillate at or near the resonant frequency of the cavity resonator. The actual frequency of operation, in any case, will depend, as previously mentioned, upon the loop phase shift characteristic of the oscillator system.

Further objects and features of this invention will be understood more completely from the following detailed description of the invention with reference to the accompanying drawings wherein.

Figures 1, 2, 3, 4, 5, 6, 7:
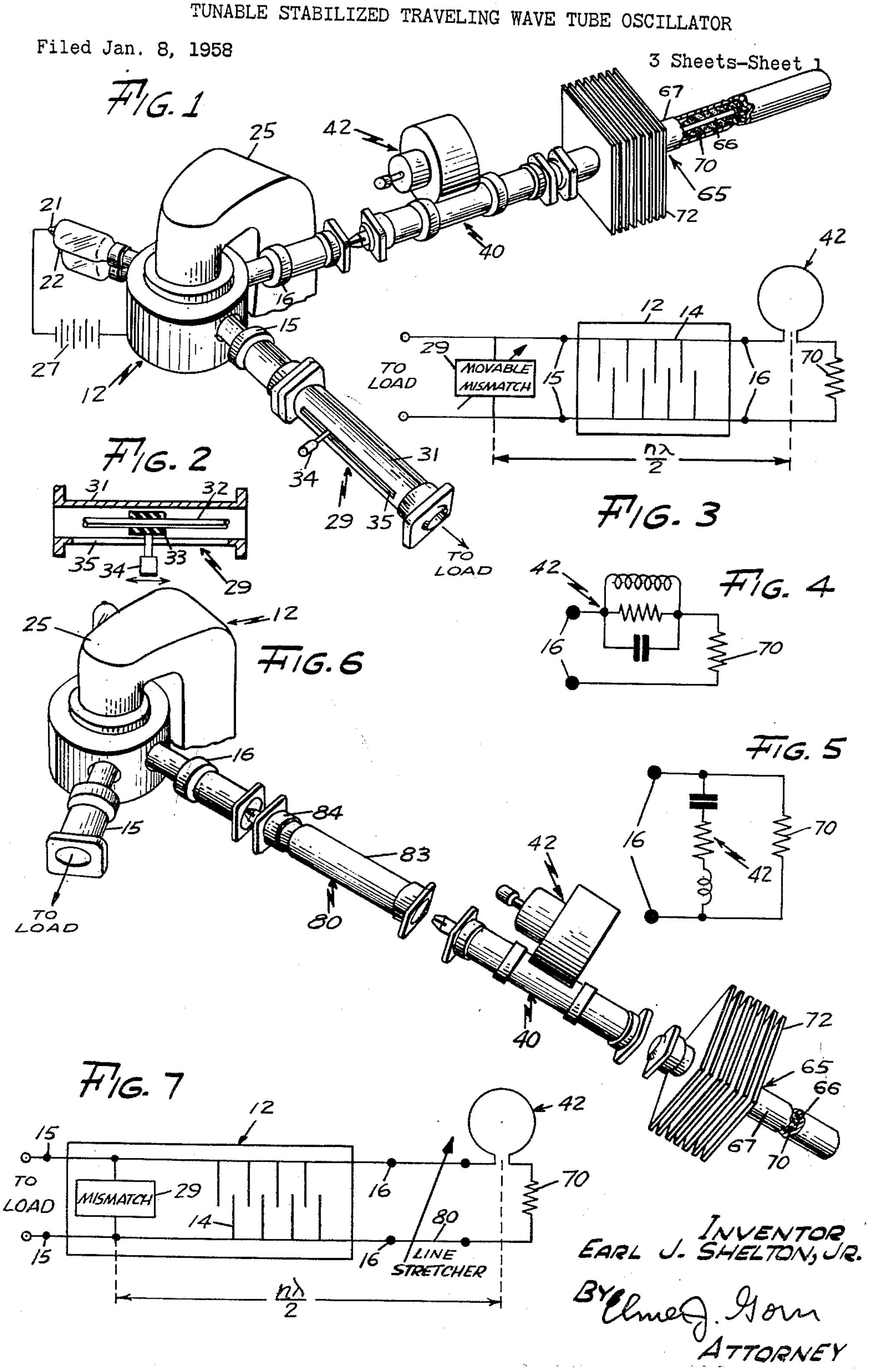
FIG. 1 is a pictorial view illustrating an oscillator system according to the invention wherein a movable mismatch is provided at the output end of the oscillator system.
FIG. 2 is a detail view showing a portion of the system of FIG. 1.
FIG. 3 is a schematic diagram of the system of FIG. 1.
FIGS. 4 and 5 are equivalent circuit diagrams of two possible arrangements of the cavity resonator and damping resistor of FIGS. 1 and 3.
FIG. 6 is a pictorial view illustrating an oscillator system analogous to that of FIG. 1 except that a stationary mismatch is provided at the output end of the oscillator system and the loop phase shift is varied by means of a line stretcher.
FIG. 7 is a schematic diagram of the system of FIG. 6.

Referring now to the drawing, a traveling wave tube, such as shown and described in the aforesaid William C. Brown application, Serial No. 362,798, filed June 19, 1953, now United States Patent No. 2,859,411, issued November 4, 1958, is indicated by the reference numeral 12. Tube 12 is identical in construction to the amplifier of this Brown application, except that the output terminal means is connected by way of a transmission line to a stabilizing cavity resonator and damping resistor combination rather than to a driving signal source, and instead of being matched at both ends, an impedance mismatch is provided in circuit with the other terminal means.

Specifically, the tube 12 includes a slow-wave propagating structure, indicated schematically in FIG. 3 by the reference numeral 14 and provided with terminal means 15 and 16, a cathode assembly coaxial with the slow-wave structure and having leads 21 and 22 visible in FIG. 1, a magnetic field-producing means 25, a portion of which is shown in FIG. 1, and an electric field-producing means 27, such as a battery, connected between the slow-wave structure and the cathode. The manner of connection of the terminal means to the slow-wave structure is shown fully in the aforesaid Brown application, Serial No. 362,798, now United States Patent No. 2,859,411. The output terminal means 15, which may be a coaxial line, is connected to a movable mismatch assembly 29; the latter may take the form of a coaxial line section having an outer conductor 31, an inner conductor 32, and a dielectric slug 33 surrounding the inner conductor and freely slidable along the inner conductor. Movement of the slug 33 may be accomplished by means of a handle 34 extending outside the coaxial line through a narrow slot 35 in outer conductor 31. The slug introduces sufficient mismatch into the output terminal means 15 of the oscillator tube 12 to permit reflection of energy from a point dependent upon the position of the slug, while also permitting a substantial amount of the energy generated within the tube 12 to reach the load. The other terminal means 16 of oscillator tube 12 is connected to a transmission line section 40 which has a tunable cavity resonator 42 coupled thereto, as shown more clearly in FIGS. 8 or 10. The arrangement shown in FIG. 8 corresponds to that indicated schematically in FIG. 4, while the arrangement shown in FIG. 10 corresponds to that indicated schematically in FIG. 5. The two types of cavity resonator arrangements, indicated in FIGS. 4 and 5, will be described in greater detail subsequently. The line section 40 in either of FIGS. 8 or 10 includes an outer conductor 44 and an inner conductor 45; the inner conductor 45 includes end portions 45', not shown in FIG. 10 and only one of which is visible in FIG. 8, made of a material whose thermal coefficient of expansion approximates that of the glass seal 47, shown only in FIG. 8, joining the inner and outer conductors to form a vacuum-type seal as well as providing a means of mechanical support for the inner conductor 45.

Figures 8, 9:
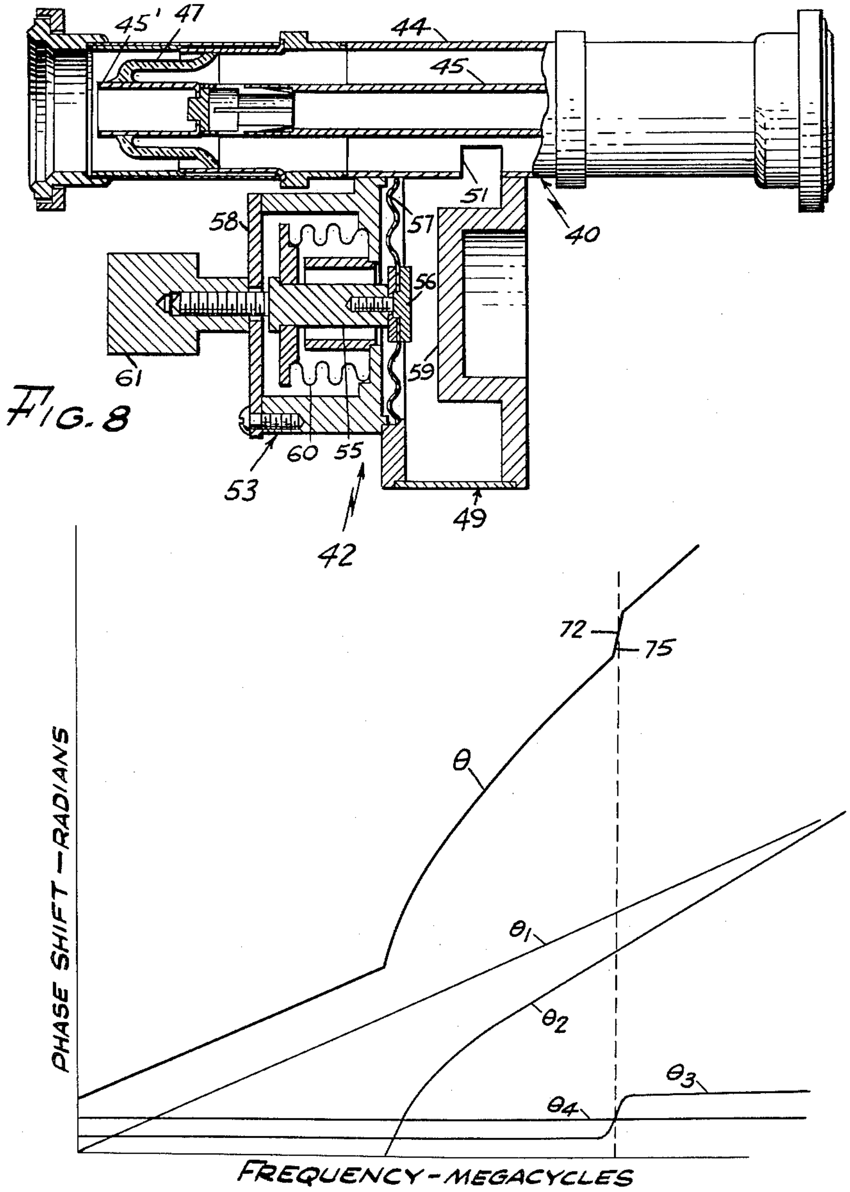
FIG. 8 is a view, partly in section, of a stabilizing cavity resonator such as used in the system of FIGS. 1 and 3 and the system of FIGS. 6 and 7 and as shown schematically in FIG. 4.
FIG. 9 is a group of curves illustrating certain principles of operation of the invention.
Figure 10:
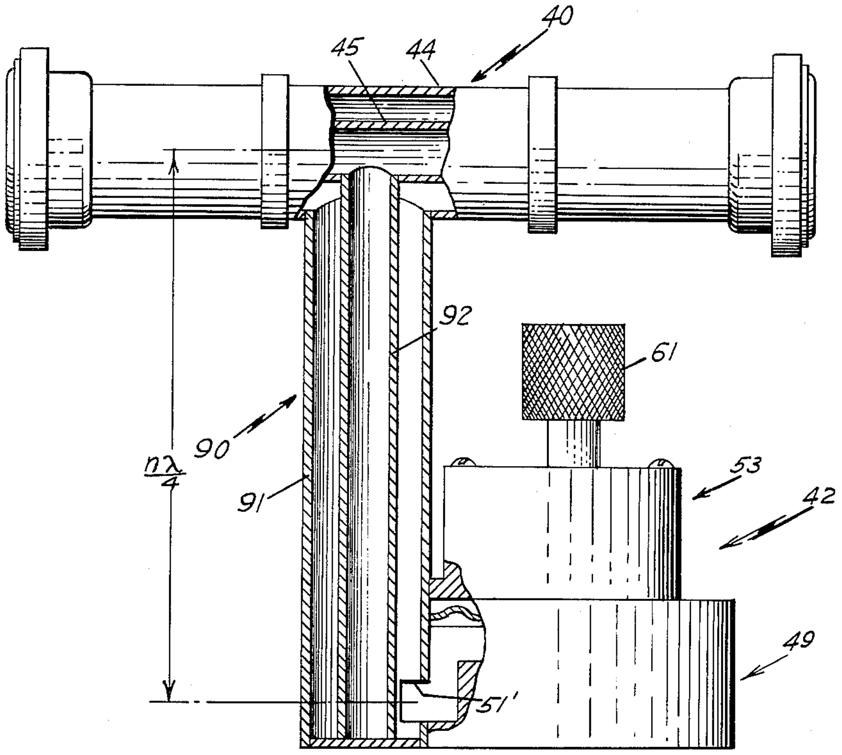
FIG. 10 is a view, partly in section, of a stabilizing cavity resonator such as used in the system of FIGS. 1 and 3 and the system of FIGS. 6 and 7 and as shown schematically in FIG. 5.

The tunable cavity resonator assembly 42 includes the cavity resonator portion 49 whose peripheral walls mount against the outer conductor 44 of line section 40 of FIG. 8 or against the outer conductor 91 of a stub line section 90 of FIG. 10. The stub line 90 further includes an inner conductor 92 attached to the inner conductor 45 of line section 40, while the outer conductor 91 of the stub line 90 is attached to the outer conductor 44 of line section 40. The circular wall of the cavity resonator portion 49 and outer conductor 44 of the line section 40 of FIG. 8 or the stub line 90 of FIG. 10 are cut away as at 51 in FIG. 8 or 51' in FIG. 10 to provide for coupling of energy between the cavity resonator portion 49 and the line section 40. The coupling slot 51' of FIG. 10 is positioned any odd number of quarter wavelengths from the longitudinal axis or center line of line section 40. Tuning of the cavity resonator of either FIG. 8 or FIG. 10 is accomplished by the tuner portion 53 of the cavity resonator assembly 42 and includes a movable piston 55 consisting of a capacitive element 56 centrally mounted in a flexible diaphragm 57 in one wall of the cavity resonator portion 49. One end of the piston 55 is threaded to receive an adjusting nut 61 which seats against an end plate 58 of the tuner portion 53. Rotary movement of the adjusting nut 61 is translated into longitudinal movement of the capacitive element 56 of the piston, and the capacity between the movable element 56 and the opposite wall 59 of the cavity resonator portion 49 is thereby altered. A bellows 60 also is included in the tuner portion for sealing purposes.

The cavity resonator line section 40 is connected to a damping resistor section 65 which, in the arrangement shown, consists of a coaxial line having an inner conductor 66, an outer conductor 67, and a damping resistor 70 in the form of an absorbing medium disposed between the inner and outer conductors of the damping resistor section. This absorbing medium, for example, may be composed of carbon and may be tapered at one end for impedance-matching purposes. Heat radiating fins 72 may be positioned about the outer conductor 66 to radiate heat produced by absorption of energy in damping resistor 70.

A schematic diagram of the oscillator system of FIG. 1 is shown in FIG. 3 wherein elements corresponding to those of FIG. 1 are indicated by the same reference numerals. Some of the energy generated within tube 12 is reflected from the movable mismatch 29 and this reflected energy travels back through the slow-wave structure of tube 12 and through terminal means 16 and the line section 40 to the cavity resonator 42. As previously indicated, the stabilizing cavity resonator 42 may be attached to the terminals 16 of tube 12 in two ways. The cavity resonator may be a parallel resonant cavity resonator in series with the damping resistor 70, or a series resonant cavity resonator in parallel with the damping resistor. The first of these arrangements is indicated schematically in FIG. 4 and structurally in FIG. 8 where the cavity resonator 42 is represented by a parallel combination of resistance, inductance and capacitance. With this arrangement, the impedance of the cavity resonator is relatively high at resonance and acts as an open circuit from which energy reflected from the movable mismatch 29 is reflected. At frequencies removed from the parallel resonant frequency of the cavity resonator 42, the latter is no longer represented by an open circuit and energy proceeds to the damping resistor 70 where it is absorbed without reflection. The second of these arrangements is indicated schematically in FIG. 5 and structurally in FIG. 10 wherein the cavity resonator 42 is represented by a series combination of resistance, capacitance and inductance. At series resonance, the impedance of the cavity resonator 42 is very low and acts essentially as a short circuit in parallel with the damping resistor. Energy that has been reflected from the movable mismatch is reflected from this short circuit at series resonance. At frequencies removed from the series resonant frequency of the cavity resonator, the latter offers an appreciable impedance in parallel with the damping resistor 70 and energy is absorbed without reflection in the damping resistor. The reflected energy from the cavity resonator during operation at the resonant frequency of the cavity resonator is then amplified according to backward wave principles and reaches the output of tube 12 at full output level. The oscillator system will oscillate only when the return loop phase shift between the cavity resonator 42 and the output mismatch 29 is an integral multiple of 360°, that is, when the output mismatch 29 and the cavity resonator 42 are spaced by $$\frac{n\lambda}{2}$$

where $n$ is an integer and $\lambda$ is the wave length at the operating frequency.

As shown in FIG. 9, there are four different phase shift components in the oscillator system which together comprise the total loop phase shift $\theta$ of the system. These phase shift components are the two-way phase shift $\theta_1$ along the transmission lines connecting the tube terminals to the output mismatch and the cavity resonator, respectively; the two-way phase shift $\theta_2$ occurring within the tube; the phase shift $\theta_3$ occurring at the cavity resonator; and the phase shift $\theta_4$ occurring at the output mismatch. These individual phase shifts combine to produce a total loop phase shift $\theta$ which is a function of frequency. Oscillations occur at frequencies where the total loop phase shift $\theta$ is an integral multiple of $2\pi$ radians. The slope of the phase shift versus frequency characteristic of the stabilizing cavity in the region of cavity resonance, indicated by the dotted line in FIG. 9, is greater than that of any other element in the oscillator circuit. The amount of reflection from the cavity resonator is substantially independent of frequency and it has been found that, in the absence of the damping resistor 70 in the oscillator system, the oscillator tends to operate at a point removed from the point on curve 72 of FIG. 9, that is, at some other point at which the total phase shift is an integral multiple of 360°. The tube may be made to oscillate in the region 75 of steep slope because of the damping resistor 70 which selectively absorbs all incident energy unless it be at a frequency close to that of the resonant frequency of the cavity resonator, leaving no reflected signal for excitation of the oscillator at frequencies and loop phase shifts corresponding to other integral multiples of $2\pi$ radians.

In some instances, especially for high power applications where arcing and undesired reflections may arise from a movable mismatch, it may be desirable to have the mismatch 29 at the load end of the oscillator system fixed in position, as by building the mismatch right into the tube itself. Also, if the mismatch 29 is positioned at or adjacent the tube output rather than in a separate line section connected to the tube output, the length of the path from the mismatch 29 to the cavity resonator may be reduced, thereby improving system operation, as well as decreasing the physical size of the system. Some examples of this type of construction are the introduction of attenuation or of an assymmetry into the slow-wave propagating structure, or adjustment of the dimensions of the means coupling the tube termination means and the end of the slow-wave structure. As previously mentioned, the return loop phase shift should be $2\pi n$ radians at the resonant frequency of the cavity resonator. In this case, the electrical distance between the mismatch and the cavity resonator is adjusted to $$\frac{n\lambda}{2}$$

by means of a line stretcher 80 inserted between the matched end of the tube and the cavity resonator 42. The line structure 80 may be similar to that described on pages 478 to 481, and illustrated on page 481, of volume 9 of the M.I.T. Radiation Laboratory Series, entitled "Microwave Transmission Circuits" by Ragan. The line stretcher, of course, can be omitted where tuning of the oscillator is not required. The system using a fixed mismatch 29 and a line stretcher 80 at the other end of the tube is shown in FIG. 6 with the equivalent circuit indicated in FIG. 7. As shown in FIG. 6, the output termination 15 of oscillator tube 12 is connected directly to the load, while the line stretcher 80 is inserted between the other termination 16 of tube 12. The line stretcher may take any one of several forms known in the art; as shown in FIG. 6, line stretcher 80 includes two telescoping coaxial lines, with the outer conductor 83 of the right hand section being slidable over the outer conductor 84 of the left hand section. The inner conductors of the telescoping line sections, not visible in FIG. 6, also slidably engage one another.

This completes the description of the embodiment of the invention illustrated herein. However, many modifications and advantages thereof will be apparent to persons skilled in the art without departing from the spirit and scope of this invention. For example, the transmission lines need not be coaxial lines but may be wave guides or other types of line capable of propagating energy generated by the oscillator. Similarly the damping resistor may be any type of resistive element whose construction depends, in part, upon the type of transmission lines used. Accordingly, it is desired that this invention not be limited to the particular details of the embodiment disclosed herein except as defined by the appended claims.

What is claimed is:

1. An oscillator system comprising an electron discharge device including a nonreentrant slow-wave energy propagating structure having output terminal means and second terminal means coupled to spaced portions of said structure, means adjacent said structure for directing electrons along paths adjacent said structure, means for connecting said output terminal means to a utilization circuit, energy-reflecting means positioned between said output terminal means and said utilization circuit, transmission means matched to said second terminal means, a cavity resonator coupled to said second terminal means, said cavity resonator providing a second energy reflecting means, and a resistive element connected in circuit with said cavity resonator for absorbing energy at frequencies other than the resonant frequency of said cavity resonator.

2. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure in energy exchanging relationship with radio frequency fields of said wave energy, first energy reflecting means coupled to said output terminal means, a cavity resonator coupled to said second terminal means, said cavity resonator providing a second energy reflecting means, and a resistive element coupled to said cavity resonator for absorbing energy at frequencies other than the resonant frequency of said cavity resonator.

3. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure in energy exchanging relationship with radio frequency fields of said wave energy, first energy reflecting means coupled to said output terminal means, a cavity resonator coupled to said second terminal means, said cavity resonator providing a second energy reflecting means, the electrical path length between said first and second reflecting means being an integral number of half wavelengths at the operating frequency of the system, and a resistive element coupled to said cavity resonator for absorbing energy at frequencies other than the resonant frequency of said cavity resonator.

4. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure in energy exchanging relationship with radio frequency fields of said wave energy, first frequency insensitive energy-reflecting means coupled to said output terminal means, a cavity resonator coupled to said second terminal means, said cavity resonator providing a second energy reflecting means, transmission means matched to said second terminal means for coupling said cavity resonator to said second terminal means, and a resistive element connected in circuit with said cavity resonator for absorbing energy at frequencies other than the resonant frequency of said cavity resonator.

5. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure in energy exchanging relationship with radio frequency fields of said wave energy, first frequency insensitive energy-reflecting means coupled to said output terminal means, a cavity resonator coupled to said second terminal means, said cavity resonator providing a second energy reflecting means, transmission means matched to said second terminal means for coupling said cavity resonator to said second terminal means, means for varying the position of said first energy reflecting means, and a resistive element connected in circuit with said cavity resonator for absorbing energy at frequencies other than the resonant frequency of said cavity resonator.

6. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure in energy exchanging relationship with radio frequency fields of said wave energy, first frequency insensitive energy-reflecting means coupled to said output terminal means, a cavity resonator coupled to said second terminal means, said cavity resonator providing a second energy reflecting means, transmission means matched to said second terminal means for coupling said cavity resonator to said second terminal means, means for varying the position of said first energy reflecting means, the electrical path length between said first and second reflecting means being some integral number of half wavelengths at the operating frequency of the system, and a resistive element connected in circuit with said cavity resonator for absorbing energy at frequencies other than the resonant frequency of said cavity resonator.

7. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure in energy exchanging relationship with radio frequency fields of said wave energy, first frequency insensitive fixed energy-reflecting means coupled to said output terminal means, a cavity resonator coupled to said second terminal means, said cavity resonator providing a second frequency insensitive energy reflecting means, transmission means matched to said second terminal means for coupling said cavity resonator to said second terminal means, means for varying the electrical length of said transmission means, and a resistive element connected in circuit with said cavity resonator for absorbing energy at frequencies other than the resonant frequency of said cavity resonator.

8. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure in energy exchanging relationship with radio frequency fields of said wave energy, first frequency insensitive fixed energy-reflecting means coupled to said output terminal means, a cavity resonator coupled to said second terminal means, said cavity resonator providing a second frequency insensitive energy reflecting means, transmission means matched to said second terminal means for coupling said cavity resonator to said second terminal means, means for varying the electrical length of said transmission means, the electrical path length between said first and second reflecting means being some integral number of half wavelengths at the operating frequency of the system, and a resistive element connected in circuit with said cavity resonator for absorbing energy at frequencies other than the resonant frequency of said cavity resonator.

9. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure more than once past said structure in the same direction in energy exchanging relationship with radio frequency fields of said wave energy, first energy reflecting means coupled to said output terminal means, a cavity resonator coupled to said second terminal means, said cavity resonator providing a second energy reflecting means, and a resistive element coupled to said cavity resonator for absorbing energy at frequencies other than the resonant frequency of said cavity resonator.

10. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure more than once past said structure in the same direction in energy exchanging relationship with radio frequency fields of said wave energy, first energy reflecting means coupled to said output terminal means, a cavity resonator coupled to said second terminal means, said cavity resonator providing a second energy reflecting means, the electrical path length between said first and second reflecting means being an integral number of half wavelengths at the operating frequency of the system, and a resistive element coupled to said cavity resonator for absorbing energy at frequencies other than the resonant frequency of said cavity resonator.

11. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure more than once past said structure in the same direction in energy exchanging relationship with radio frequency fields of said wave energy, first energy reflecting means coupled to said output terminal means, a series resonant cavity resonator coupled to said second terminal means, said cavity resonator providing a second energy reflecting means, and a resistive element connected in parallel with said cavity resonator for absorbing energy at frequencies other than the resonant frequency of said cavity resonator.

12. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure more than once past said structure in the same direction in energy exchanging relationship with radio frequency fields of said wave energy, first energy reflecting means coupled to said output terminal means, a series resonant cavity resonator coupled to said second terminal means, said cavity resonator providing a second energy reflecting means, the electrical path length between said first and second reflecting means being an integral number of half wavelengths at the operating frequency of the system, and a resistive element connected in parallel with said cavity resonator for absorbing energy at frequencies other than the resonant frequency of said cavity resonator.

13. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure more than once past said structure in the same direction in energy exchanging relationship with radio frequency fields of said wave energy, first energy reflecting means coupled to said output terminal means, a parallel resonant cavity resonator coupled to said second terminal means, said cavity resonator providing a second energy reflecting means, and a resistive element connected in series with said cavity resonator for absorbing energy at frequencies other than the resonant frequency of said cavity resonator.

14. An oscillator system comprising an electron discharge device including a nonreentrant slow-wave energy propagating structure for propagating electromagnetic wave energy, said structure having output terminal means and second terminal means coupled to spaced portions of said structure, means adjacent said structure for directing electrons along paths adjacent said structure more than once past said structure in the same direction in energy exchanging relationship with radio frequency fields of said wave energy, first energy reflecting means coupled to said output terminal means, a parallel resonant cavity resonator coupled to said second terminal means, said cavity resonator providing a second energy reflecting means, the electrical path length between said first and second reflecting means being an integral number of half wavelengths at the operating frequency of the system, and a resistive element connected in series with said cavity resonator for absorbing energy at frequencies other than the resonant frequency of said cavity resonator.

References Cited in the file of this patent

UNITED STATES PATENTS

| | | |
|---|---|---|
| 2,485,030 | Bradley | Oct. 18, 1949 |
| 2,501,052 | Herlin | Mar. 21, 1950 |
| 2,738,422 | Koros | Mar. 13, 1956 |
| 2,859,411 | Brown | Nov. 4, 1958 |
| 2,922,918 | Wasserman | Jan. 26, 1960 |